United States Patent [19]
Lee et al.

[11] Patent Number: 6,087,900
[45] Date of Patent: Jul. 11, 2000

[54] PARALLEL PUSH-PULL AMPLIFIER USING COMPLEMENTARY DEVICE

[75] Inventors: Kwy-Ro Lee, Taejon-si; Bon-Kee Kim, Sungnam-si, both of Rep. of Korea

[73] Assignee: Korea Advanced Institute of Science and Technology, Rep. of Korea

[21] Appl. No.: 09/130,328

[22] Filed: Aug. 6, 1998

[30] Foreign Application Priority Data

Dec. 17, 1997 [KR] Rep. of Korea ....................... 97-69739

[51] Int. Cl.⁷ ...................................................... H03F 3/18
[52] U.S. Cl. ........................................... 330/264; 330/267
[58] Field of Search .................................... 330/264, 267, 330/277

[56] References Cited

U.S. PATENT DOCUMENTS

| Re. 31,749 | 11/1984 | Yamashiro | 330/264 |
| 4,943,784 | 7/1990 | Rybicki | 330/264 |
| 5,029,298 | 7/1991 | Chiba et al. | 330/285 |
| 5,541,554 | 7/1996 | Stengel et al. | 330/51 |
| 5,754,078 | 5/1998 | Tamagawa | 330/264 |

*Primary Examiner*—Robert Pascal
*Assistant Examiner*—Khanh Van Nguyen
*Attorney, Agent, or Firm*—Bachman & LaPointe, P.C.

[57] ABSTRACT

A parallel push-pull amplifier using a complementary device, which basically operates for a B or AB-level amplification while having a common source configuration, thereby being capable of amplifying the full wave of an input signal without any distortion while obtaining a high gain at a radio frequency. The complementary device consists of an active element for amplifying a half wave of an input signal and a complementary active element for amplifying the other half wave of the input signal. The complementary active element has a duality with respect to the active element. The amplifier also includes bias circuits adapted to set respective operating points of the active and complementary active elements. Where the active and complementary active elements constitute a CMOS device, they are connected together in the form of a push-pull connection using a common source type configuration. Where the active and complementary active elements constitute a BJT, they are connected together using a common emitter configuration. This amplifier takes only the advantages of both the existing -source follower configuration and common source configuration while eliminating the disadvantages of those configurations, thereby achieving a high efficiency and a high linearity. Accordingly, it is possible to provide a power amplifier capable of obtaining a sufficient power gain even at a radio frequency.

2 Claims, 3 Drawing Sheets

PARALLEL PUSH-PULL AMPLIFIER USING COMPLEMENTARY DEVICE

BACKGROUND OF THE INVENTION

1. Field of the Invention

The present invention relates to a power amplifier, and more particularly to a parallel push-pull amplifier using a complementary device, which basically operates for a B or AB-level amplification while having a common source configuration, thereby being capable of amplifying the full wave of an input signal without any distortion while obtaining a high gain at a radio frequency.

2. Description of the Prior Art

Generally, push-pull amplifiers have a configuration including a pair of symmetrically-connected active elements. Voltage signals having the same voltage level, but having a phase difference of 180° therebetween are applied to respective input terminals of the active elements. Since such a push-pull amplifier operates in such a manner that non-linearities of characteristic curves of transistors, which are used for the active elements, complement each other, it achieves an improvement in linearity and an increase in distortionless maximum power. In this regard, such a push-pull amplifier is used for a power amplifier.

Typically, push-pull amplifiers have an operating point corresponding to a cut-off point (class B amplification) in order to achieve an improvement in power efficiency.

Where such push-pull amplifiers are used for a low frequency amplification, they have a connection in the form of a source follower.

Meanwhile, for a radio frequency amplification, amplifiers having a connection in the form of a common source are used.

Now, examples of the above mentioned source follower type push-pull amplifier and common source type amplifier will be described in conjunction with FIGS. 1 and 2.

FIG. 1 is a circuit diagram illustrating a conventional push-pull amplifier having a source follower configuration. In this push-pull amplifier shown in FIG. 1, when an input signal, which has a maximum voltage level and a positive polarity, is applied to the input of the amplifier, one transistor, namely, an NMOS transistor Q1, turns on, while the other transistor, namely, a PMOS transistor Q2, turns off. As a result, a positive voltage Vdd, which is a drive voltage applied to the drain of the NMOS transistor Q1, is applied to the output of the amplifier.

On the other hand, when the input signal applied to the input of the amplifier has a negative polarity, the NMOS transistor Q1 turns off, while the PMOS transistor Q2 turns on. Where an input signal, which has a minimum voltage level and a negative polarity, is applied to the input of the amplifier, the drive voltage Vdd applied to the drain of the NMOS transistor Q1 is prevented from being applied to the output of the amplifier. In this case, the potential of the ground connected to the drain of the PMOS transistor Q2 is applied to the output of the amplifier.

The above mentioned push-pull amplifier using a source follower configuration is advantageous in that it exhibits a small output resistance. In particular, where such a push-pull amplifier is used for a class B or class AB amplification, it is possible to obtain a maximum efficiency.

The push-pull amplifier of FIG. 1, which uses a source follower configuration, has a limitation in the output voltage swing range. That is, the output voltage swing range is limited between the ground potential and the drive voltage.

Furthermore, the push-pull amplifier achieves a power amplification only using a current gain, namely, without using any voltage gain, because of its performance characteristics. This results in a considerable limitation in obtaining power gain. As a result, the power-push amplifier is limited to applications for a low frequency amplification because its maximum available gain is small.

For this reason, the above mentioned push-pull amplifier, which uses a source follower configuration suitable only for a low frequency amplification, is improper for a radio frequency amplification requiring an efficient use of the the characteristics of the entire device. In view of such a problem, amplifiers of a source grounding type, called a common source type, have been proposed for a radio frequency amplification.

Referring to FIG. 2, a conventional common source type amplifier is illustrated. In this amplifier, an inductor Lb having a choke function is used to hold a bias. Accordingly, a constant bias voltage Vdd is provided at the output of the amplifier. At this time, a current Idd is also output. When an AC signal is applied to the amplifier, the inductor Lb serves as an open circuit for radio frequency signals. Accordingly, the AC signal is added to the bias voltage, which is a DC signal. As a result, the current at the output of the amplifier may vary in a range from 0 to 2 Idd. In this case, the output voltage may also vary in a range from 0 to 2 Vdd. Therefore, there is an advantage in obtaining high power.

Although the amplifier having the above mentioned common source configuration is advantageous in that a high gain can be obtained at a radio frequency, as compared to that of the source follower configuration, it involves a severe distortion of output waves when it is used for a class B or class AB amplification. This is because the amplifier exhibits dynamic characteristics indicated by a load line of FIG. 3. In other words, the generation rate of harmonic components increases because this amplifier is configured to amplify only a half of an input sine wave, As a result, there is a problem in terms of linearity. For this reason, such an amplifier cannot be applied to circuits requiring a high linearity.

Therefore, it is required to provide a power amplifier with a high linearity and a high efficiency which is capable of amplifying an input signal without any distortion of the entire wave thereof while obtaining a high gain at a radio frequency, in order to solve the problems involved in conventional push-pull power amplifiers having a source follower configuration and conventional power amplifiers having a common source configuration.

SUMMARY OF THE INVENTION

An object of the invention is to solve the above mentioned problems and to provide a high-linearity, high-efficiency, parallel push-pull amplifier using a complementary device, which basically operates for a class B or class AB amplification while having a common source configuration, thereby being capable of amplifying the full wave of an input signal without any distortion while obtaining a high gain at a radio frequency.

In accordance with the present invention, this object is accomplished by providing a parallel push-pull amplifier comprising: a pair of complementary elements coupled to each other in a push-pull manner using a common source configuration, one of the complementary elements being an active element adapted to amplify a half wave of an input signal with the other complementary element being a complementary active element adapted to amplify the other half wave of the input signal; and a first and a second bias circuit adapted to set respective operating points of the active and complementary active elements.

The active and complementary active elements comprise an NMOSFET and a PMOSFET, respectively. The NMOSFET and PMOSFET are coupled at gates thereof to each other to constitute an input terminal and coupled at drains thereof to constitute an output terminal. The NMOSFET and PMOSFET are also coupled at sources thereof to a ground and a first supply voltage. The first bias circuit comprises a first inductor coupled to the first supply voltage, the inductor having a drain coupled to the NMOSFET, and a second inductor coupled to a second supply voltage, the second inductor having a gate coupled to the NMOSFET. The second bias circuit comprises a third inductor coupled to a third supply voltage and coupled to the gate of the PMOSFET, and a fourth inductor coupled to the ground and to the drain of the PMOSFET.

BRIEF DESCRIPTION OF THE DRAWINGS

Other objects and aspects of the invention will become apparent from the following description of embodiments with reference to the accompanying drawings in which.

DESCRIPTION OF THE PREFERRED EMBODIMENTS

Figure 1:
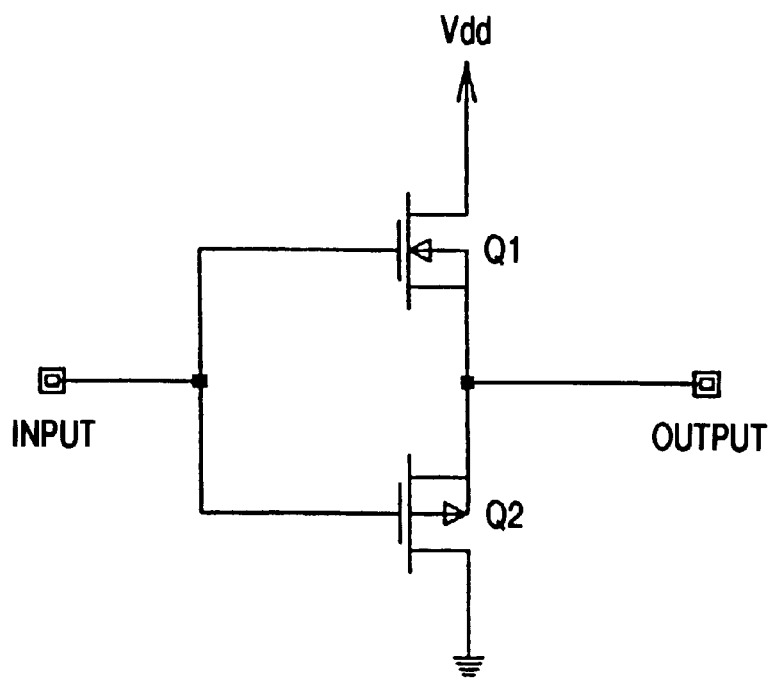
FIG. 1 is a circuit diagram illustrating a conventional push-pull amplifier having a source follower configuration.
Figure 2:
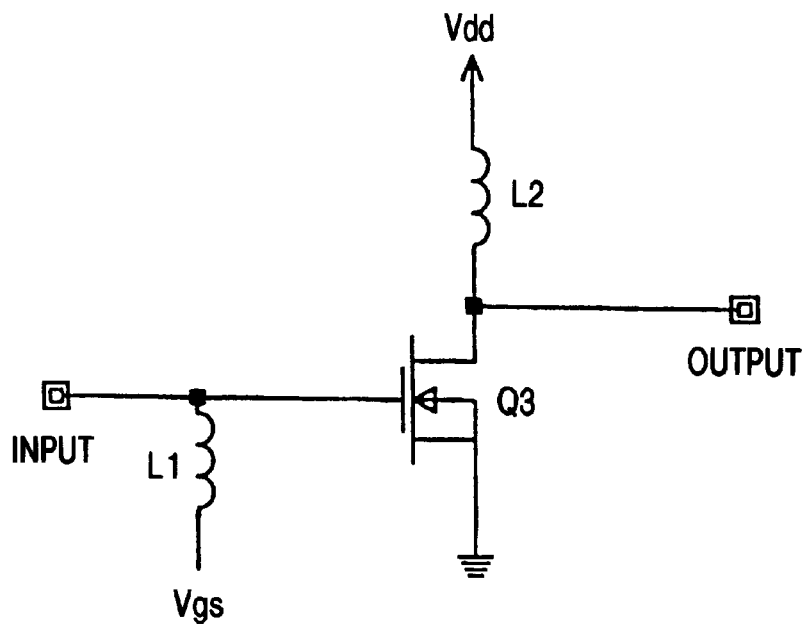
FIG. 2 is a circuit diagram illustrating a conventional common source type amplifier.
Figure 3:
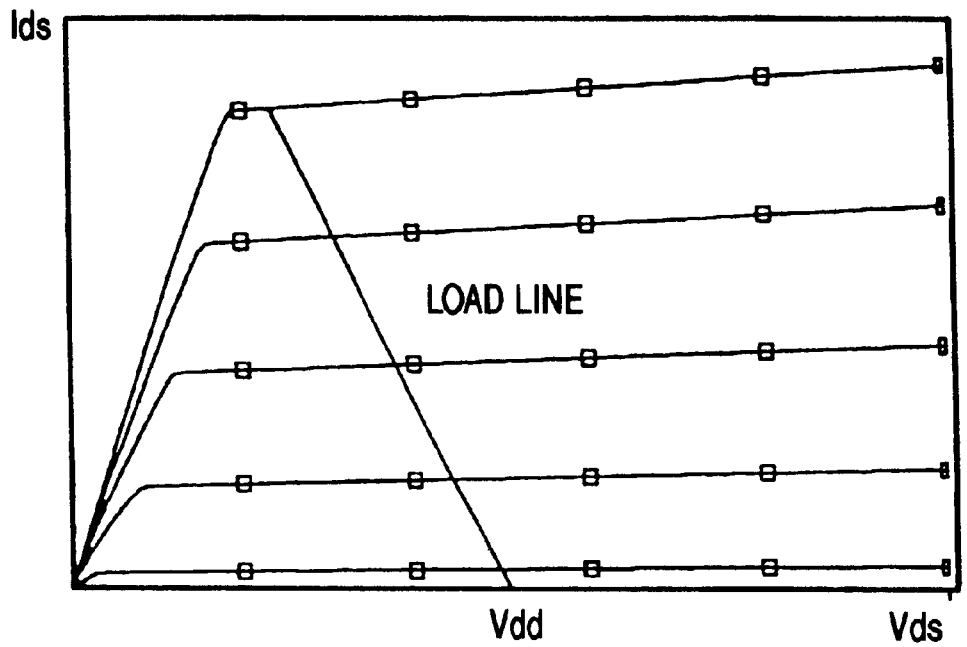
FIG. 3 is a graph depicting a load line in a conventional common source type amplifier adapted for a class B amplification.
Figure 4:
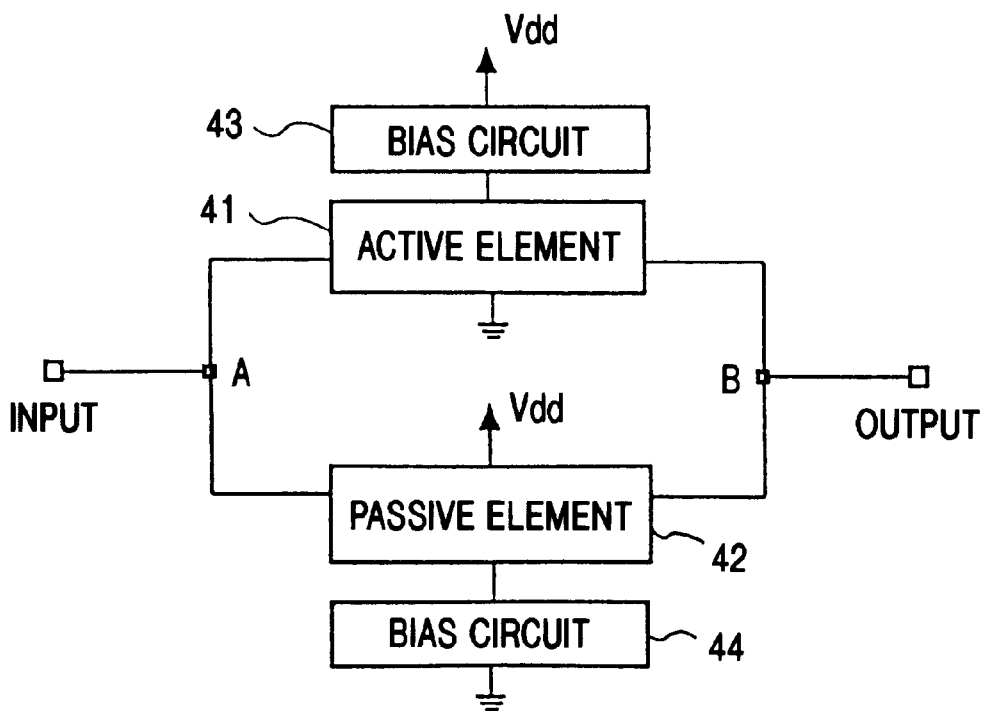
FIG. 4 is a block diagram illustrating a push-pull amplifier using a complementary device in accordance with the present invention.

Referring to FIG. 4, a push-pull amplifier having a basic configuration according to the present invention is illustrated.

As shown in FIG. 4, the push-pull amplifier includes an active element 41 adapted to amplify a half wave of an input signal, a complementary active element 42 having a duality with respect to the active element 41 and serving to amplify the other half wave of the input signal, and bias circuits 43 and 44 adapted to set respective operating points of the active and complementary active elements 41 and 42.

Here, such active and complementary active elements 41 and 42 are elements having a duality as in NMOS and PMOS transistors of a MOSFET or npn and pnp transistors in a BJT. Where the active and complementary active elements 41 and 42 constitute a CMOS device, they are connected together in the form of a push-pull connection using a common source type configuration. Where the active and complementary active elements 41 and 42 constitute a BJT, they are connected together using a common emitter configuration.

Now, the operation of the push-pull amplifier having the above mentioned configuration according to the present invention will be described.

The active element 41 amplifies a half wave of an input signal, namely, a signal having a phase ranging from 0° to 180°, applied to an input terminal A of the amplifier at an operating point set by a bias circuit 43. On the other hand, the complementary active element 42 amplifies the remaining half wave of the input signal, namely, a signal having a phase ranging from 180° to 360°, at an operating point set by a bias circuit 44.

The signals respectively amplified by the active and complementary active elements 41 and 42 are summed together at an output terminal B of the amplifier. Thus, the full wave of the input signal, which is a sine wave, is amplified.

Figure 5:
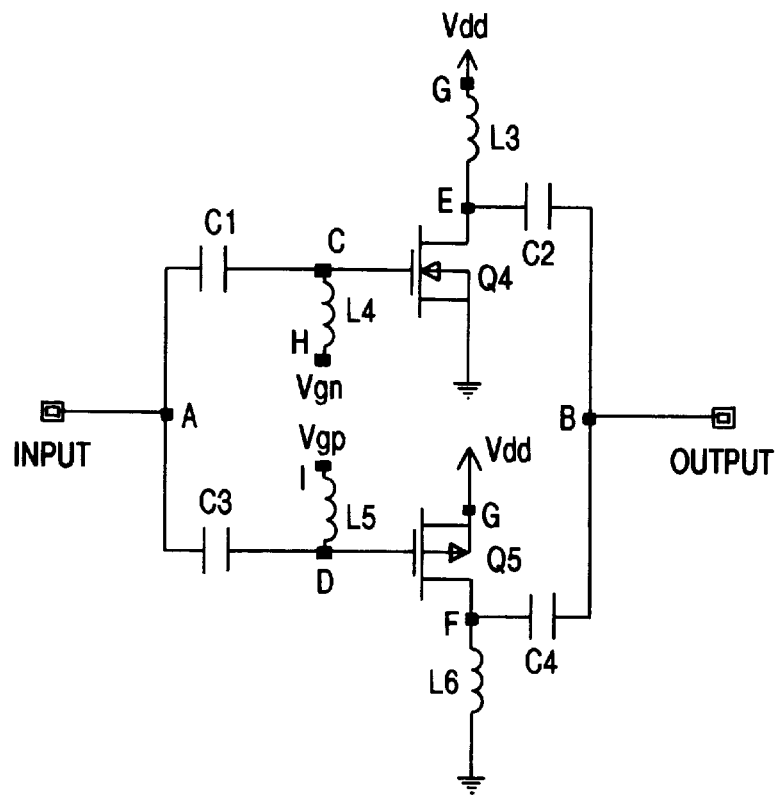
FIG. 5 is a circuit diagram illustrating a push-pull amplifier using a CMOS device in accordance with the present invention.

FIG. 5 is a circuit diagram illustrating a push-pull amplifier having the configuration of FIG. 4, which is configured using a CMOS device.

This amplifier includes an NMOS transistor Q4 as the active element 41, and a PMOS transistor Q5 as the complementary active element 42. These NMOS and PMOS transistors Q4 and Q5 are connected together in a push-pull manner using a common source configuration.

The NMOS transistor Q4 is coupled at its drain to a node E between an inductor L3 coupled to a terminal G for a supply voltage Vdd and a capacitor C2 coupled to an output terminal B. The NMOS transistor Q4 is also coupled at its gate to a node C between a capacitor coupled to an input terminal A and an inductor L4 coupled to a terminal H for another supply voltage Vgn.

The PMOS transistor Q5 is coupled at its source to the terminal G for the supply voltage Vdd. The PMOS transistor Q5 is also coupled at its gate to a node D between a capacitor C3 coupled to the input terminal A and an inductor L5 coupled to a terminal I for a supply voltage Vgp. The drain of the PMOS transistor Q5 is coupled to a node F between a grounded inductor L6 and the output terminal B.

Figure 6:
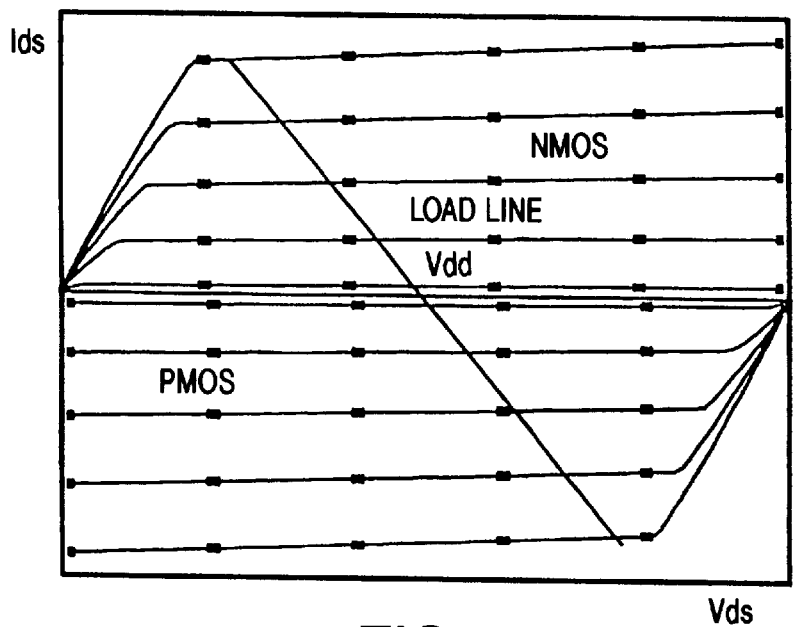
FIG. 6 is a graph depicting a load line in the push-pull amplifier of FIG. 5.

The amplifier having the above mentioned configuration exhibits dynamic characteristics indicated by a load line of FIG. 6. This amplifier operates as follows:

The NMOS transistor Q4, which is an active element, amplifies a half wave of an input signal, namely, a signal having a phase ranging from 0° to 180°, applied to an input terminal A of the amplifier at an operating point biased by the inductors L3 and L4. On the other hand, the PMOS transistor Q5, which is a complementary active element, amplifies the remaining half wave of the input signal, namely, a signal having a phase ranging from 180° to 360°, at an operating point biased by the inductors L4 and L6.

Accordingly, respective half waves of the input signal are amplified by the NMOS transistor Q4 and PMOS transistor Q5 and then summed together at the output terminal B.

In this case, each of the capacitors C1 to C4 is a blocking capacitor which serves as an open circuit for DC and as a short circuit for AC. Each of the inductors L3 to L6 is a radio frequency choke which serves as a short circuit for DC and as an open circuit for AC.

The above mentioned push-pull amplifier of the present invention has various advantages as compared to conventional amplifiers of both the source follower and common source types.

For example, since the push-pull amplifier of the present invention basically uses a common source configuration, a sufficient maximum available gain is obtained. That is, there is no problem encountered in the source follower configuration due to a low maximum available gain. It is also possible to extend the output voltage swing level up to twice the drive voltage Vdd. Accordingly, an increase in gain up to twice or more can be obtained in terms of the maximum power.

In the case of class B amplifiers having a common source configuration, a distortion of an output wave occurs inevitably because only a half wave of an input signal is amplified. This results in a problem concerned with the linearity. However, the full wave of an input sine wave is amplified in accordance with the configuration of the present invention. Accordingly, there is an advantage in terms of power gain, as compared to conventional amplifiers having a common source configuration. It is also possible to obtain waves involving little distortion at the output of the amplifier.

As apparent from the above description, the present invention provides a parallel push-pull amplifier using a complementary device, which takes only the advantages of both the existing source follower configuration and common source configuration while eliminating the disadvantages of those configurations, thereby achieving a high efficiency and a high linearity. In accordance with the present invention, it is possible to provide a power amplifier capable of obtaining a sufficient power gain even at a radio frequency.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A parallel push-pull amplifier comprising:

a first supply voltage;

a ground;

a pair of complementary elements coupled between said first supply voltage and said ground in parallel, one of the complementary elements being an active element adapted to amplify a half wave of an input signal with the other complementary element being a complementary active element adapted to amplify the other half wave of the input signal; and a first bias circuit and a second bias circuit adapted to set respective operating points of the active element and the complementary active element.

2. The parallel push-pull amplifier according to claim 1, wherein:

the active element and complementary active element comprise an NMOSFET and a PMOSFET, respectively, the NMOSFET and PMOSFET being coupled at gates thereof to each other to constitute an input terminal and coupled at drains thereof to constitute an output terminal, the NMOSFET and the PMOSFET being also coupled at sources thereof to said ground and said first supply voltage;

wherein the first bias circuit comprises a first inductor coupled between the first supply voltage and the drain of the NMOSFET, and a second inductor coupled between a second supply voltage and the gate of the NMOSFET; and wherein the second bias circuit comprises a third inductor coupled between a third supply voltage and the gate of the PMOSFET, and a fourth inductor coupled between the ground and the drain of the PMOSFET.

* * * * *

UNITED STATES PATENT AND TRADEMARK OFFICE
CERTIFICATE OF CORRECTION

PATENT NO. : 6,087,900
DATED : July 11, 2000
INVENTOR(S) : Kwy-Ro Lee et al.

It is certified that error appears in the above-identified patent and that said Letters Patent is hereby corrected as shown below:

Column 6, claim 1,
Line 7, the following should be inserted after "signal" -- , the active element and the complementary active element comprising an NMOSFET and a PMOSFET, respectively --;
Line 10, the following should be inserted after "element" -- , the first bias circuit comprising a first inductor coupled between the first supply voltage and the drain of the NMOSFET, and a second inductor coupled between a second supply voltange and the gate of the NMOSFET, the second bias circuit comprising a third inductor coupled between a third supply voltage and the gate of the PMOSFET, and a fourth inductor coupled between the ground and the drain of the PMOSFET --;

Column 6, claim 2,
Lines 13-15, the following should be deleted "the active element and complementary active element comprise an NMOSFET and a PMOSFET, respectively,"; and
Lines 20-29, the following should be deleted "; wherein the first bias circuit comprises a first inductor coupled between the first supply voltage and the drain of the NMOSFET, and a second inductor coupled between a second supply voltage and the gate of the NMOSFET; and wherein the second bias circuit comprises a third inductor coupled between a third supply voltage and the gate of the PMOSFET, and a fourth inductor coupled between the ground and the drain of the PMOSFET".

Signed and Sealed this

Sixth Day of November, 2001

*Attest:*

NICHOLAS P. GODICI
*Attesting Officer*     Acting Director of the United States Patent and Trademark Office